(12) United States Patent
Etherton et al.

(10) Patent No.: US 8,009,397 B2
(45) Date of Patent: Aug. 30, 2011

(54) METHOD AND CIRCUIT FOR EFUSE PROTECTION

(75) Inventors: Melanie Etherton, Austin, TX (US); Michael G. Khazhinsky, Austin, TX (US); Eyal Melamed-Kohen, Modin (IL); Valery Neiman, Richon-Lezion (IL)

(73) Assignee: Freescale Semiconductor, Inc., Austin, TX (US)

( * ) Notice: Subject to any disclaimer, the term of this patent is extended or adjusted under 35 U.S.C. 154(b) by 744 days.

(21) Appl. No.: 12/139,106

(22) Filed: Jun. 13, 2008

(65) Prior Publication Data
US 2009/0310266 A1    Dec. 17, 2009

(51) Int. Cl.
*H02H 9/00* (2006.01)
(52) U.S. Cl. .......................................................... 361/56
(58) Field of Classification Search ................ 361/56
See application file for complete search history.

(56) References Cited

U.S. PATENT DOCUMENTS

| | | | |
|---|---|---|---|
| 6,469,884 B1 * | 10/2002 | Carpenter et al. | ............ 361/111 |
| 6,785,107 B1 | 8/2004 | Schmitt | |
| 6,882,214 B2 | 4/2005 | Spenea et al. | |
| 7,271,988 B2 | 9/2007 | Chung et al. | |
| 7,271,989 B2 * | 9/2007 | Huang et al. | .................. 361/91.1 |
| 7,400,480 B2 * | 7/2008 | Huang et al. | ..................... 361/56 |
| 7,782,581 B1 * | 8/2010 | Perisetty | .......................... 361/56 |
| 2004/0190208 A1 | 9/2004 | Levit | |
| 2006/0028777 A1 | 2/2006 | Chung et al. | |
| 2006/0152272 A1 * | 7/2006 | Sueoka | ......................... 327/525 |
| 2007/0279816 A1 | 12/2007 | Chung et al. | |
| 2007/0279817 A1 | 12/2007 | Huang et al. | |

OTHER PUBLICATIONS

PCT Application No. PCT/US2009/036758 Search Report and Written Opinion, Mailed Jan. 27, 2010.

* cited by examiner

*Primary Examiner* — Ronald W Leja
(74) *Attorney, Agent, or Firm* — Robert L. King; Charles Bergere (57) ABSTRACT

An eFuse (electronic fuse) circuit has a first detector for determining whether an ESD (electrostatic discharge) event occurs at a circuit pad of an integrated circuit and provides an ESD trigger signal in response thereto. A second detector detects a presence of a first power supply voltage and provides a power on signal indicating the presence of the first power supply voltage. A fuse is permitted to be programmable when no detection of the ESD event occurs and at the same time a presence of the power on signal is detected. The fuse is not permitted to be programmed when an ESD event is detected or when there is an absence of the power on signal. An array of fuses is thereby protected from inadvertent programming from an ESD event or powering up an integrated circuit.

20 Claims, 4 Drawing Sheets

METHOD AND CIRCUIT FOR EFUSE PROTECTION

BACKGROUND

1. Field

This disclosure relates generally to electronically programmable fuses (eFuse), and more specifically, to a method and circuit for protecting eFuses from accidental programming during power-up and electrostatic discharge (ESD) events.

2. Related Art eFuses are generally programmed by forcing a large electrical current through them. This high current is intended to break the eFuse structure which results in an electrical open. For conventional eFuse programming, the eFuse structure to be programmed is typically selected by a decoded address which is generated by a control circuit that is powered by a low voltage supply ($V_{DD}$). An eFuse programming command is created by additional logic circuitry which generates a program enable signal. The program enable signal is converted from the voltage level of the logic supply ($V_{DD}$) to the voltage level of the programming supply ($PV_{DD}$) by a level shifter. The program enable signal may be amplified by several driver stages. If an eFuse is selected by the control logic and a program enable signal is present, a current can pass through the selected eFuse for programming. During an ESD event on the programming supply ($PV_{DD}$), the voltage on this supply can increase to a high level of several volts. Since the supply voltage of the control circuit and the circuitry generating the program enable signal is not actively powered during the ESD event, the outputs of these circuits can be in an undefined state during the ESD event. This may create conditions for unwanted eFuse programming. In addition, during power-up, if $PV_{DD}$ is ramped up before the voltage supply of the control circuit, this can also create conditions for unwanted eFuse programming.

As a result, with currently used eFuses and the associated programming circuitry, there is a risk that the eFuses are being programmed by high voltages and currents that can occur during an undesirable ESD event. There is also a risk that the eFuses can be falsely programmed during a circuit power up, when it is possible that the circuitry for controlling the programming matrix of the eFuses is in an undefined state due to power sequencing issues.

Accordingly, there is a need for an improved method and apparatus for overcoming the problems in the art as discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As discussed herein, each signal may be designed as positive or negative logic, where negative logic can be indicated by a bar over the signal name or an "_B" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

As used herein, $V_{DD}$ is representative of a first supply voltage useful to provide power to a control circuit that selects the eFuses to be programmed. In addition, as used herein, $V_{SS}$ is representative of a reference voltage. Furthermore, as used herein, $PV_{DD}$ is representative of a second supply voltage, in particular, useful in programming an eFuse.

According to the embodiments of the present disclosure, protection circuitry is configured to disable the programming supply of the eFuses in a fuse array during ESD events and during power-up events. This advantageously eliminates the risk of false programming of the eFuses during any of these events. For ESD, a trigger signal is generated by an ESD network, wherein the ESD trigger signal is high during the ESD event and low during normal circuit operation. For power-up, a signal is derived from the supply voltage of a logic block that controls an eFuse address matrix.

In one embodiment, the eFuse protection circuit logically disables the programming of eFuse when one or more of the following occur. In a first scenario, an ESD signal (ESD_TRIGGER) is high in response to the ESD network detecting an ESD event and low during power off and normal operation. The ESD_TRIGGER signal is used to disable a high voltage programming supply ($PV_{DD}$) whenever ESD_TRIGGER is high, i.e. during any event that is recognized by the ESD network as an ESD event. In a second scenario, the low voltage supply ($V_{DD}$) that powers an eFuse address matrix is off. The protection circuit further comprises circuitry configured in conjunction with the high voltage programming ($PV_{DD}$) supply and the low voltage ($V_{DD}$) supply, which disables the $PV_{DD}$ supply in a prescribed manner as discussed herein whenever $V_{DD}$ is low, e.g. in connection with a power-up event.

Figure 1:
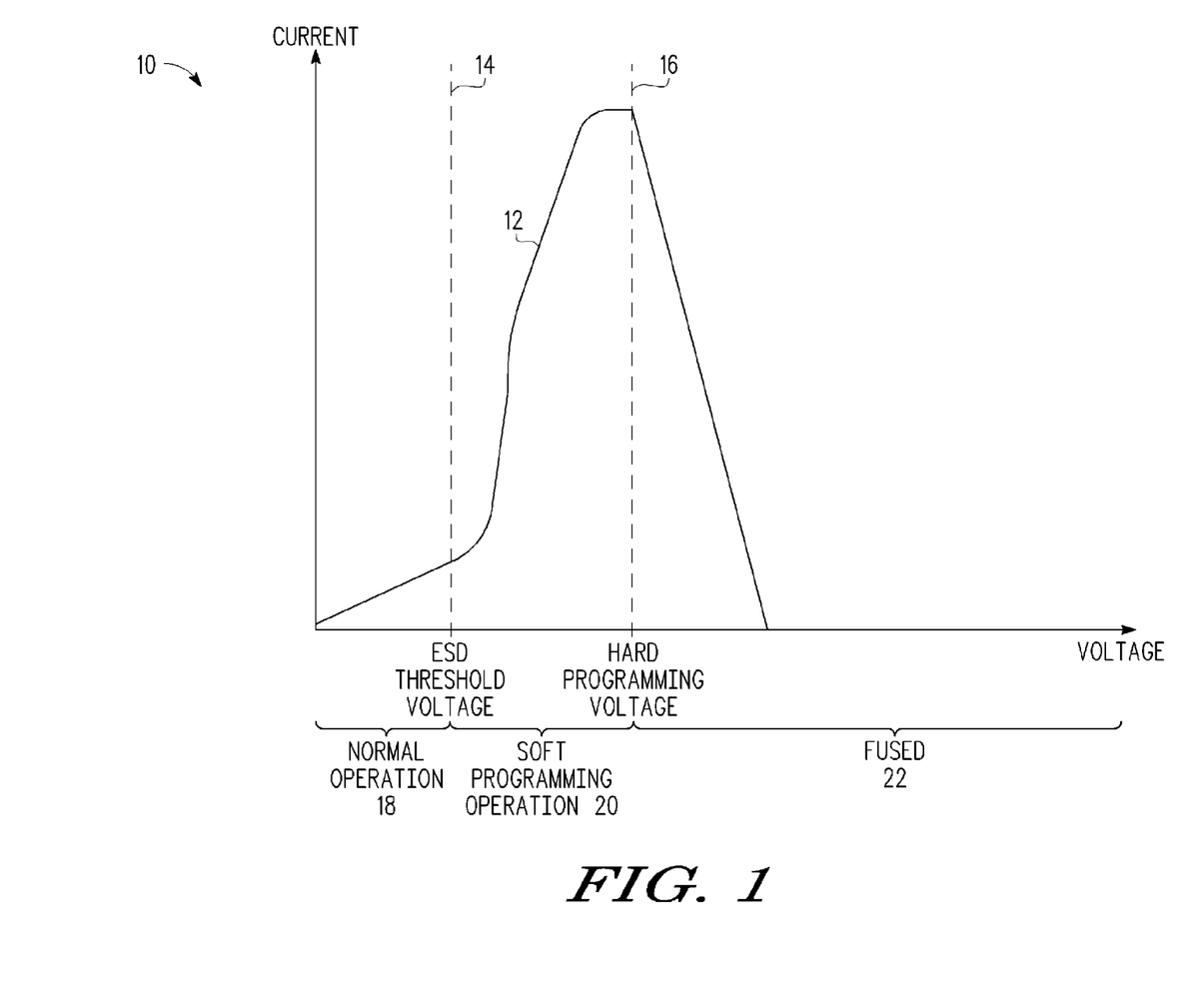
FIG. 1 is an illustrative characterization plot of current versus voltage for an eFuse stressed with a series of pulses from lower to increasing voltage magnitudes.

Referring now to the drawings, FIG. 1 is an illustrative characterization plot 10 of current versus voltage for an eFuse stressed with a series of pulses from lower to increasing voltage magnitudes. Current is represented on the vertical axis, extending from a low current to increasing current. Voltage is represented on the horizontal axis, extending from a low voltage to increasing voltage. Characterization curve 12 is generally representative of a current/voltage characteristic of a given eFuse. More particularly, the characterization curve 12 is representative of a characteristic of an eFuse in which the eFuse starts to change its characteristics when stressed with short pulses of different voltage magnitudes. In one embodiment, the characterization pulses can include 100 nanosecond (100 ns) pulses. Other pulse durations for the characterization may also be useful. In general, all eFuses possess such a current/voltage characteristic. In addition, two voltages are noted on the horizontal axis. A first notable voltage includes an ESD threshold voltage 14. A second notable voltage includes a hard programming voltage 16.

For a series of pulses having voltage magnitudes less than the ESD threshold voltage 14, the eFuse operates within a normal operation range 18 and its current is fairly linear. In the normal operating range 18, no destruction occurs to the eFuse. For a series of pulses having voltage magnitudes greater than the ESD threshold voltage 14 but less than the hard programming voltage 16, the eFuse operates according to a soft programming operation range 20 and its current is non-linear. The non-linear current characteristic is illustrative of a changing resistive behavior of the eFuse in response to pulses having magnitudes within the range from the ESD threshold voltage 14 to the hard programming voltage 16. In the soft programming operation range 20, while some amount of destruction occurs to the eFuse, the eFuse remains partially conductive. In addition, eFuse leakage changes from leakage values which occur during normal operation of the eFuse. For any pulses having voltage magnitudes greater than the hard programming voltage 16, the eFuse is fused and its current goes to zero. In other words, responsive to application of pulses with voltage magnitudes in the fused range 22, sufficient destruction of the eFuse occurs to thereby program the eFuse. From the eFuse characterization plot 10, it can be noted that during an ESD event, the ESD voltage across the eFuse should be kept below the ESD threshold voltage 14 to protect the eFuse from undesired destruction.

As conveyed via the illustration of FIG. 1, for eFuses possessing the representative characterization 12, the eFuses start to change their characteristics when stressed with short pulses above the ESD threshold voltage 14. In one embodiment, the ESD threshold voltage may be on the order of less than a few volts, for example, 1.3 V. In addition, voltages in the range above the ESD threshold voltage 14 can likely occur during ESD stress, therefore eFuses need to be protected during ESD. One manner of providing protection is to ensure that during ESD, the voltage across the eFuse is kept below the ESD threshold voltage 14.

Figure 2:
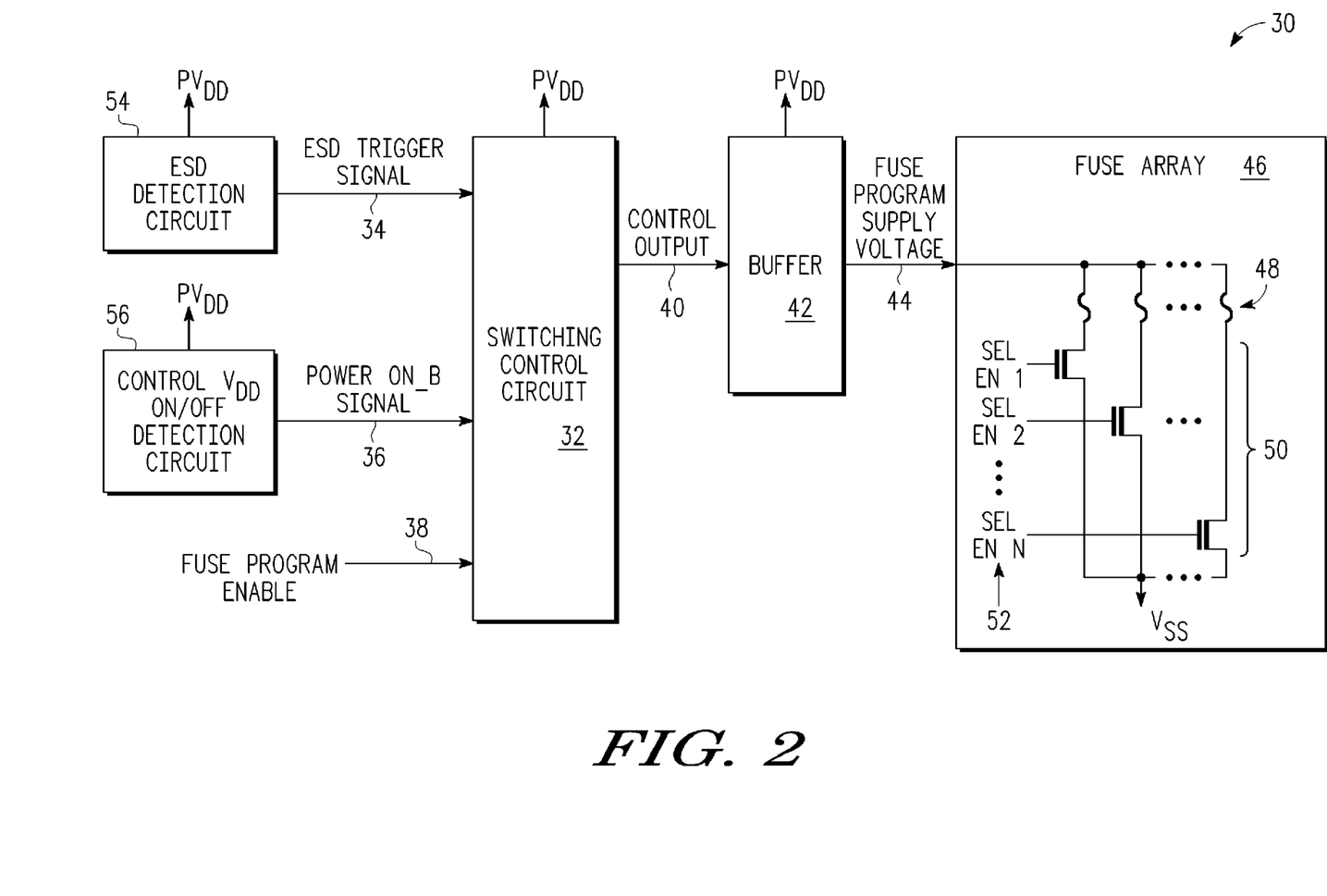
FIG. 2 is a block diagram view of a circuit for eFuse protection according to one embodiment of the present disclosure.

FIG. 2 is a block diagram view of a circuit 30 for eFuse protection according to one embodiment of the present disclosure. Circuit 30 comprises a switching control circuit 32 having several inputs (34,36,38) and an output (40). A first input 34 is configured to receive an ESD TRIGGER signal. A second input 36 is configured to receive a POWER ON_B signal. A third input 38 is configured to receive a FUSE PROGRAM ENABLE signal. The output 40 provides a control output signal which is generated in response to the various inputs according to the configuration of the switching control circuit 32. Circuit 30 further comprises a buffer 42 having an input that is coupled to the output 40 of the switching control circuit 32. Responsive to the CONTROL OUTPUT signal of the switching control circuit, buffer 42 provides a FUSE PROGRAM SUPPLY VOLTAGE on output 44.

Circuit 30 still further comprises a fuse array 46. Fuse array 46 includes a number of eFuses, generally indicated by reference numeral 48, and corresponding select transistors, generally indicated by reference numeral 50. The particular number of eFuses 48 in array 46 is determined according to the requirements of a given integrated circuit implementation. Certain ones of the select transistors 50 are enabled according to a corresponding select enable input signal, which are generally indicated by reference numeral 52, as applied to corresponding gates of the select transistors 50. For example, as illustrated, fuse array 46 includes an array of N fuse, where N is an integer. Accordingly, there are N select enable inputs SEL EN 1, SEL EN 2, . . . , to SEL EN N. Each branch of the fuse array 46 includes an eFuse 48 and a select transistor 50. The eFuse 48 is coupled to the FUSE PROGRAM SUPPLY VOLTAGE 44 at one end and to a S/D terminal of the corresponding select transistor 50 on the other end. In addition, the other S/D terminal of the corresponding select transistor 50 is coupled to $V_{SS}$.

Figure 4:
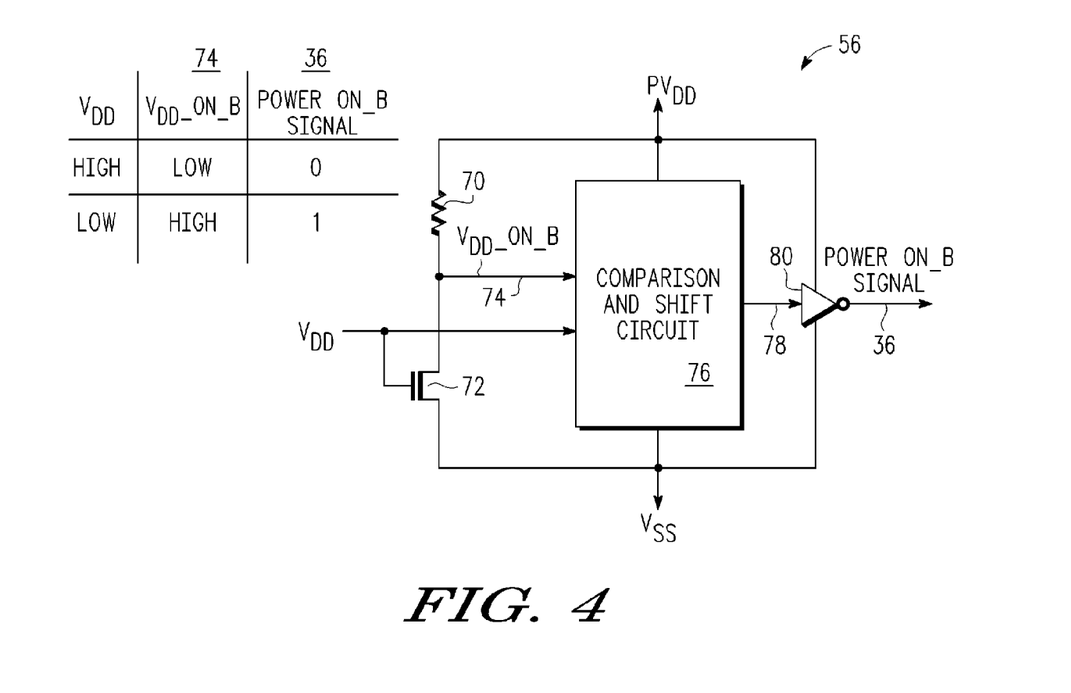
FIG. 4 is a schematic block diagram view of a Control $V_{DD}$ ON/OFF detection circuit for use in the eFuse protection circuit of FIG. 2 according to one embodiment of the present disclosure.
Figure 5:
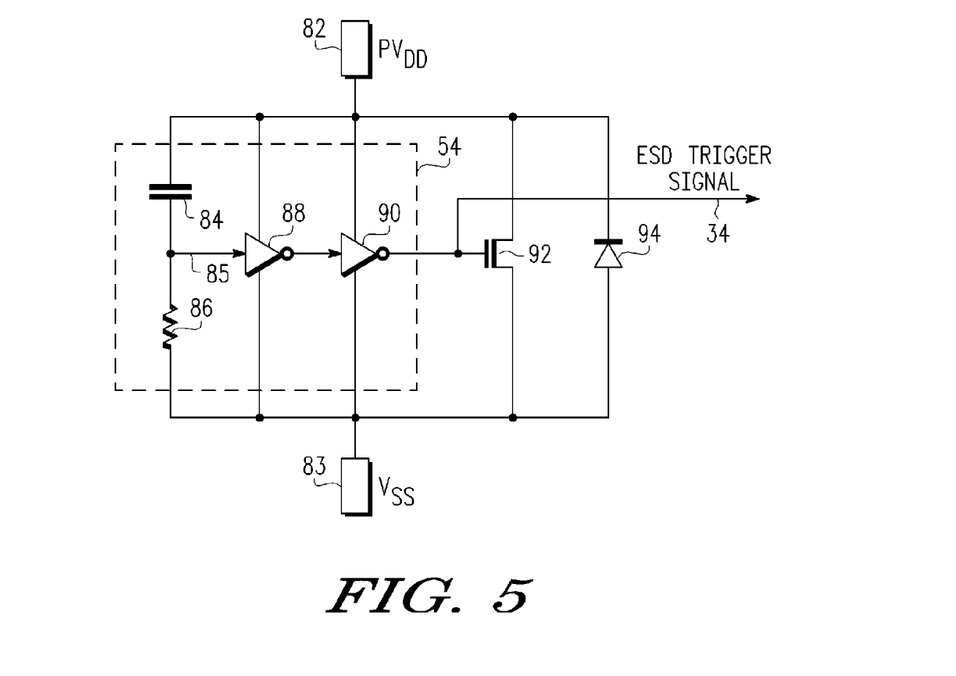
FIG. 5 is a schematic block diagram view of an ESD detection circuit for use in the eFuse protection circuit of FIG. 2 according to one embodiment of the present disclosure.

The eFuse protection circuit 30 still further comprises an ESD detection circuit 54 and Control $V_{DD}$ ON/OFF detection circuit 56, to be discussed further herein with reference to FIGS. 5 and 4, respectively. ESD detection circuit 54 is configured to provide an ESD TRIGGER signal 34 in response to detection of the occurrence of an ESD event in connection with a circuit pad for $PV_{DD}$. Control $V_{DD}$ ON/OFF detection circuit 56 is configured to provide a POWER ON_B signal 36 in response to detection of $V_{DD}$ being in an ON or OFF state.

Figure 3:
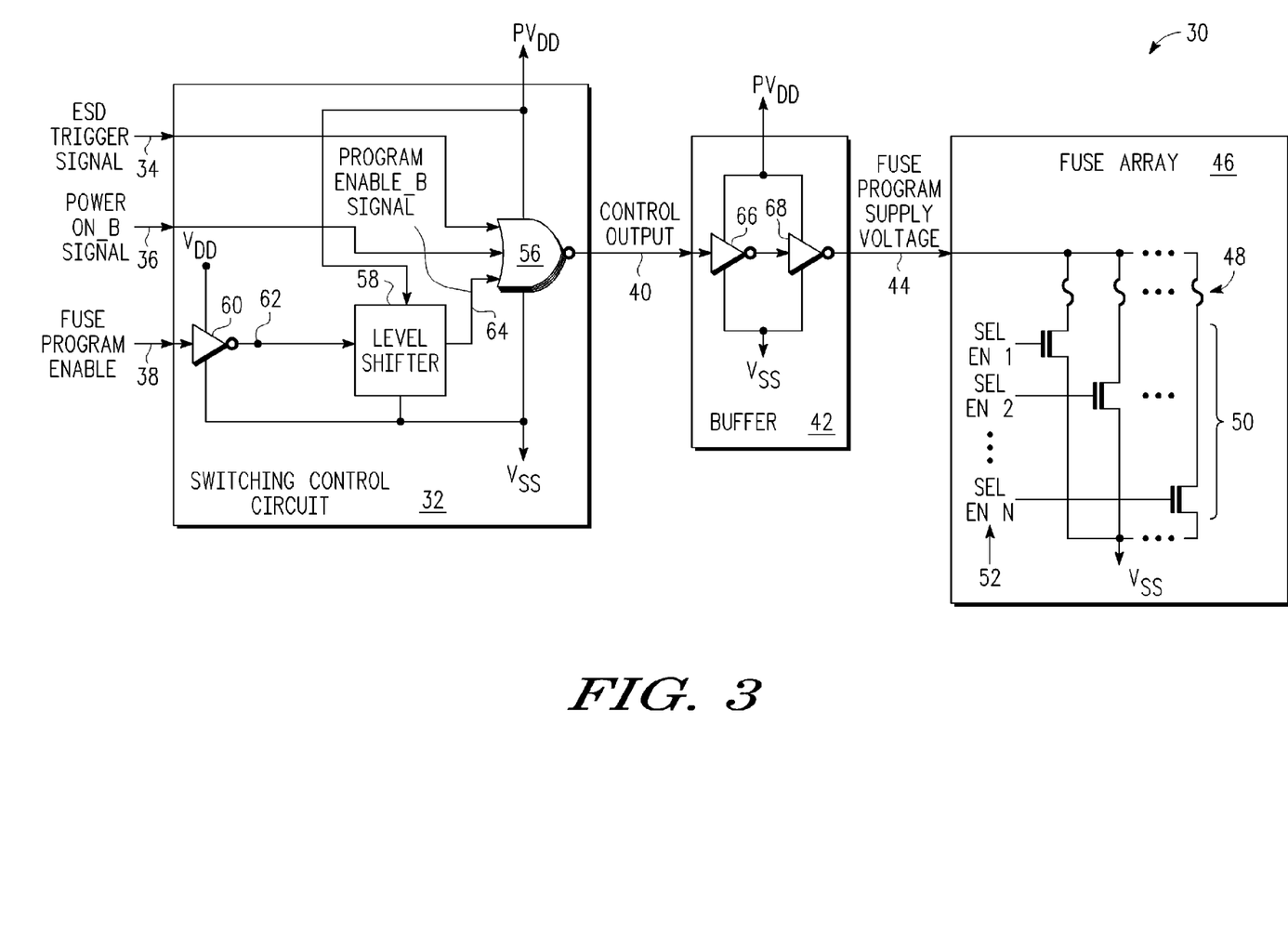
FIG. 3 is a schematic block diagram view of several blocks of the eFuse protection circuit of FIG. 2 in greater detail according to one embodiment of the present disclosure.

FIG. 3 is a schematic block diagram view of several blocks of the eFuse protection circuit 30 of FIG. 2 in greater detail according to one embodiment of the present disclosure. Switching control circuit 32 includes a NOR gate 56, a level shifter 58, and a first inverter 60. NOR gate 56 has three inputs which include ESD TRIGGER signal 34, POWER ON_B signal 36 and a PROGRAM ENABLE_B signal 64. NOR gate 56 is further coupled between $PV_{DD}$ and $V_{SS}$. Responsive to the inputs, NOR gate 56 provides an output representative of the CONTROL OUTPUT 40 of switching control circuit 32. NOR gate 56 creates a high level CONTROL OUTPUT on the signal line 40 if ESD TRIGGER signal 34 is low, POWER ON_B signal 36 is low, and PROGRAM ENABLE_B signal is low. Level shifter 58 is coupled between $PV_{DD}$ and $V_{SS}$, and furthermore receives as its input 62 the output of the first inverter 60. Responsive to the input, level shifter 58 provides the PROGRAM ENABLE_B signal on output signal line 64. Level shifter 58 is configured to shift a voltage level on signal input 62 to a level of a second power supply voltage, corresponding to $PV_{DD}$. The output 64 of level shifter 58 corresponds to the PROGRAM ENABLE_B signal. The first inverter 60 is coupled between $V_{DD}$ and $V_{SS}$, and also receives as input the FUSE PROGRAM ENABLE signal 38. The output 62 of the first inverter 60 is coupled to the input of the level shifter 58.

With reference still to FIG. 3, in one embodiment, buffer 42 comprises second and third inverters, 66 and 68, respectively. The second and third inverters 66 and 68 are each coupled between $PV_{DD}$ and $V_{SS}$. Second inverter 66 receives as input the CONTROL OUTPUT signal 40 of switching control circuit 32. The output of the second inverter 66 is coupled to the input of the third inverter 68. The third inverter 68 provides an output representative of the FUSE PROGRAM SUPPLY VOLTAGE 44 of buffer circuit 42. Buffer circuit 42 is configured to amplify the CONTROL OUTPUT signal 40 to provide FUSE PROGRAM SUPPLY VOLTAGE 44 appropriate for a desired programming of eFuses of the fuse array 46.

Circuit 30 of FIG. 3 is thus configured to eliminate risk for false programming during power-up and ESD. The NOR gate 56 disables the FUSE PROGRAM ENABLE signal 38 (which may also be referred to as a write command) whenever the supply $V_{DD}$ of the eFuse control logic is OFF (e.g., during power-up) or whenever the ESD_TRIGGER signal 34 is high (e.g., indicative of the occurrence of ESD event). Even if $PV_{DD}$ gets high during power up or during an ESD event, the eFuse programming is disabled as long as $V_{DD}$ is low or the ESD_TRIGGER signal is high.

FIG. 4 is a schematic block diagram view of a Control $V_{DD}$ ON/OFF detection circuit 56 for use in the eFuse protection circuit 30 of FIG. 2 according to one embodiment of the present disclosure. The Control $V_{DD}$ ON/OFF detection circuit 56 comprises a voltage divider that includes resistive element 70 in series with transistor 72. A first end of the resistive element 70 couples to $PV_{DD}$ and the other end of the resistive element 70 couples to a first S/D terminal of transistor 72. The other S/D terminal of transistor 72 is coupled to $V_{SS}$. The voltage obtained via the voltage divider is provided on signal line 74, herein referred to as $V_{DD}$_ON_B. The voltage signal $V_{DD}$_ON_B comprises a low voltage level if $V_{DD}$ is high and if $V_{DD}$ is low, then the voltage signal $V_{DD}$_ON_B comprises a voltage level on the order of (or comparable with) the voltage $PV_{DD}$. Transistor 72 is controlled via the presence of voltage $V_{DD}$ on the gate of transistor 72. In other words, the voltage level of $V_{DD}$_ON_B depends on the state of $V_{DD}$: when $V_{DD}$ is high, the transistor 72 is turned on and $V_{DD}$_ON_B gets tied to a low voltage level $V_{SS}$. Oppositely, when $V_{DD}$ is low, then the voltage level of $V_{DD}$_ON_B gets pulled to a high voltage level, approximately on the order of $PV_{DD}$.

Circuit 56 further includes a comparison and shift circuit 76. Comparison and shift circuit 76 is coupled between $PV_{DD}$ and $V_{SS}$. Responsive to inputs $V_{DD}$ and $V_{DD}$_ON_B, comparison and shift circuit 76 provides an output on signal line 78. Control $V_{DD}$ ON/OFF detection circuit 56 compares signals $V_{DD}$_ON_B and $V_{DD}$ and if $V_{DD}$ is high and $V_{DD}$_ON_B is low, then circuit 56 produces a high output signal. On the other hand, if $V_{DD}$ is low and $V_{DD}$_ON_B is high, then circuit 56 produces a low output signal. In this configuration, both signals, $V_{DD}$ and $V_{DD}$_ON_B, are needed for the circuit to decide if $V_{DD}$ is powered up.

Circuit 56 further includes an inverter 80. Inverter 80 is coupled between $PV_{DD}$ and $V_{SS}$, and also receives as input the output 78 of comparison and shift circuit 76. The output 36 of inverter 80 constitutes the output of circuit 56, also referred to herein as the POWER ON_B signal 36. Control $V_{DD}$ ON/OFF detection circuit 56 is configured to provide a first output in response to $V_{DD}$ being in a high state, and $V_{DD}$_ON_B being in a low state. Control $V_{DD}$ ON/OFF detection circuit 56 is configured to provide a second output in response to $V_{DD}$ being in a low state, and $V_{DD}$_ON_B being in a high state. In one embodiment, the first and second outputs of POWER ON_B signal 36 correspond to logic 0 and logic 1, respectively.

FIG. 5 is a schematic block diagram view of an ESD detection circuit 54 for use in the eFuse protection circuit 30 of FIG. 2 according to one embodiment of the present disclosure. The ESD detection circuit 54 comprises an RC trigger stage that includes a capacitive element 84 in series with a resistive element 86. A first end of the capacitive element 84 couples to $PV_{DD}$, and more particularly to a circuit pad 82 for $PV_{DD}$. In addition, the other end of the capacitive element 84 couples to a first end of resistive element 86. The other end of resistive element 86 is coupled to $V_{SS}$, and more particularly to a circuit pad 83 for $V_{SS}$. The signal obtained via the RC trigger stage is provided on signal line 85. Circuit 54 further includes first and second serially coupled inverters, 88 and 90, respectively. First and second serially coupled inverters, 88 and 90, respectively, are coupled between $PV_{DD}$ and $V_{SS}$. Responsive to an ESD event on circuit pad 82, ESD detection circuit 54 provides an ESD TRIGGER signal on output 34.

Also shown with ESD detection circuit 54 on FIG. 5 is an ESD clamp transistor 92 and diode 94. ESD clamp transistor 92 and diode 94 are coupled between circuit pad 82 for $PV_{DD}$ and circuit pad 83 for $V_{SS}$. ESD clamp transistor 92 is configured to conduct in response to an ESD TRIGGER signal 34 on the gate of ESD clamp transistor 92. Diode 94 is configured to provide a current path from circuit pad 83 for $V_{SS}$ to the circuit pad 82 for $PV_{DD}$ during the occurrence of an ESD event.

Referring still to FIG. 5, the ESD detection circuit 54 is configured to protect the $PV_{DD}$ supply. During an ESD event on the circuit pad 82 for the $PV_{DD}$ supply, the voltage on the $PV_{DD}$ supply circuit pad 82 will rise quickly, the voltage on signal line 85 will also rise, which pulls up the voltage on ESD_TRIGGER signal 34 through the two inverter stages 88 and 90, and which also turns on the ESD clamp transistor 92. During normal operation, the ESD_TRIGGER signal is low. According to the embodiments of the present disclosure, the false programming of an eFuse during an ESD event is advantageously prevented by using the ESD_TRIGGER signal to ensure that FUSE PROGRAM SUPPLY VOLTAGE 44 (FIG. 2) will never be high when ESD_TRIGGER signal is high. When the ESD_TRIGGER signal is low during normal operation, the eFuses can be programmed. Adding the ESD_TRIGGER signal as an input to the NOR gate 56 of the switching control circuit 32 ensures that the eFuse can not be programmed during an ESD event on $PV_{DD}$, even if there is a potential higher than zero on $V_{DD}$.

In one embodiment, the eFuses comprises poly silicon eFuses. Other materials for the eFuses may also be useful. In addition, the embodiments of the present disclosure can be practiced using programming voltages on the order of 3 volts.

The embodiments of the present disclosure advantageously protect an eFuse array during power up and ESD events with the addition of logic circuitry to the programming supply. In addition, the embodiments separate the eFuse from the programming source with a buffer which uses the combined signals for power up and ESD as input control. Furthermore, the embodiments actively control the input of the programming buffer with a signal generated by an actively triggered ESD protection circuit. Moreover, the embodiments combine the control for ESD with control of the programming circuit during power-up. The embodiments of the present disclosure advantageously provide for high protection levels of eFuse during ESD, simpler and less area intensive ESD protection used to protect the eFuses during ESD (lower cost) and the embodiments facilitate turn on of integrated circuit chip power supplies without power sequencing.

Accordingly, the embodiments of the present disclosure are advantageously configured to prevent false programming of eFuses during ESD events and during integrated circuit chip power up. The embodiments of the present disclosure are further configured to prevent eFuses from being programmed by the high voltages and currents that can occur during an ESD event. At the same time, the embodiments of the present disclosure advantageously ensure that the eFuses are not programmed unintentionally during power up when the circuitry controlling the programming matrix of the eFuses can be in an undefined state.

By now it should be appreciated that there has been provided an eFuse protection circuit comprising: a first detection circuit coupled to a circuit pad for detecting an ESD event and having an output for providing an ESD trigger signal in response thereto; a second detection circuit coupled to a first power supply voltage terminal for detecting a presence of a first power supply voltage and having an output for providing a power on signal indicating the presence of the first power supply voltage; a switching control circuit having a first input coupled to the output of the first detection circuit, a second input coupled to the output of the second detection circuit and an output for providing a control signal; and at least one fuse coupled to the switching control circuit, programming of the at least one fuse being permitted in response to the control signal, the control signal being coupled to the at least one fuse by the switching control circuit if no detection of the ESD event occurs and no absence of the power on signal is detected.

The eFuse protection circuit further comprises: a buffer circuit coupled between the switching control circuit and the at least one fuse, the buffer circuit having an input for receiving and amplifying a voltage magnitude of the control signal and providing a fuse program voltage to the at least one fuse in response thereto. In one embodiment, the switching control circuit further comprises: a multiple input logic gate having a first input for receiving the ESD trigger signal, a second input for receiving the power on signal, a third input for receiving a fuse program enable signal, and an output for providing the control signal in an active state when the fuse program signal is asserted, no ESD event is detected and the first power supply voltage is indicated to be present.

In a further embodiment, the switching control circuit further comprises: circuitry powered by the first power supply voltage, the circuitry having an input for receiving the fuse program enable signal and buffering the fuse program enable signal. In addition, the switching control circuit further comprises: a level shifter powered by a second power supply voltage having an input coupled to an output of the circuitry powered by the first power supply voltage, the level shifter providing a shifted form of the fuse program enable signal. Furthermore, the second detection circuit further comprises: a comparison and level shifting circuit having a power terminal for receiving the second power supply voltage, an input terminal for receiving the first power supply voltage, and an output; and an inverter having an input coupled to the output of the comparison and level shifting circuit, and an output for providing the power on signal, the inverter having a power terminal for receiving the second power supply voltage.

In another embodiment, the at least one fuse can comprise a plurality of fuses, each fuse of the plurality being coupled in series with a select transistor controlled by a respective different select signal, each series-coupled fuse and select transistor being coupled between a first terminal for receiving the fuse program voltage and a second terminal for receiving a reference voltage.

According to another embodiment of the present disclosure, a method comprises: providing a first detector for determining whether an ESD event occurs at a circuit pad of an integrated circuit and providing an ESD trigger signal in response thereto; providing a second detector for detecting a presence of a first power supply voltage and providing a power on signal indicating the presence of the first power supply voltage; and permitting a fuse to be programmable when no detection of the ESD event occurs and at the same time a presence of the power on signal is detected, said fuse not being permitted to be programmed when an ESD event is detected or in an absence of the power on signal. In another embodiment, the method further comprises: providing a switching control circuit having a first input coupled to an output of the first detector, a second input coupled to the output of the second detector and an output for providing a control signal. In addition, the method can further comprise: coupling a buffer circuit between the switching control circuit and the fuse, the buffer circuit having an input for receiving and amplifying a voltage magnitude of the control signal and providing a fuse program voltage to the fuse in response thereto.

In another embodiment, the method further comprises: providing a multiple input logic gate having a first input for receiving the ESD trigger signal, a second input for receiving the power on signal, a third input for receiving a fuse program enable signal, and an output for providing the control signal in an active state when the fuse program signal is asserted, no ESD event is detected and the first power supply voltage is indicated to be present. The method further comprises: buffering and level shifting the fuse program enable signal before coupling the fuse program enable signal to the third input of the multiple input logic gate. In yet another embodiment, the method further comprises: implementing the circuit pad as a voltage pad for receiving a second supply voltage, the second supply voltage having a magnitude that is greater than the first supply voltage and being used to derive a program voltage for the fuse. In a still further embodiment, the circuit pad comprises a power supply pad of an integrated circuit, the integrated circuit including the eFuse protection circuit.

In a still further embodiment, a circuit comprises: a power supply detection circuit for detecting a presence within the circuit of a first power supply voltage, the power supply detection circuit providing a power on signal when the first power supply voltage is present in the circuit; an ESD detection circuit coupled to a circuit pad for receiving a second power supply voltage, the ESD detection circuit detecting an ESD event at the circuit pad and providing an ESD signal in response to the detecting; a switching control circuit having a first input coupled to the power supply detection circuit, a second input coupled to the ESD detection circuit, a third input coupled to a program enable signal, and an output for providing a control signal to permit fuse programming when no ESD event is detected, the first power supply voltage is detected and the program enable signal is asserted; and a fuse array coupled to the switching control circuit, the fuse array comprising a plurality of fuses each coupled in series with a respective select transistor between a program voltage terminal and a reference voltage terminal, the fuse array being selectively programmed in response to the control signal. The circuit further comprises: a buffer circuit having an input coupled to the output of the switching control circuit and an output coupled to the program voltage terminal of the fuse array, the buffer circuit buffering the control signal to provide a fuse program supply voltage to program voltage terminal of the fuse array.

In yet another embodiment, the switching control circuit further comprises: a NOR logic gate having a first input coupled to the first input of the switching control circuit, a second input coupled to the second input of the switching control circuit, a third input coupled to the third input of the switching control circuit, and an output for providing the control signal in an active state when the fuse program signal is asserted, no ESD event is detected and the first power supply voltage is indicated to be present. The switching control circuit can further comprise: circuitry powered by the first power supply voltage, the circuitry having an input for receiving the program enable signal and buffering the program enable signal; and a level shifter powered by a second power supply voltage having an input coupled to an output of the circuitry powered by the first power supply voltage, the level shifter providing a shifted form of the program enable signal. In another embodiment, the power supply detection circuit further comprises: a comparison and level shifting circuit coupled to the first power supply voltage and the second power supply voltage, the comparison and level shifting circuit comparing a voltage magnitude of the first power supply voltage to a known voltage value that is dependent on the first power supply voltage to determine if the first power supply voltage is on. In still another embodiment, the plurality of fuses comprises polysilicon fuses that are programmed with a program voltage value of no greater than 3.3 volts.

Because the apparatus implementing the present invention is, for the most part, composed of electronic components and circuits known to those skilled in the art, circuit details have not been explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An eFuse protection circuit comprising:
   a first detection circuit coupled to a circuit pad for detecting an ESD event and having an output for providing an ESD trigger signal in response thereto;
   a second detection circuit coupled to a first power supply voltage terminal for detecting a presence of a first power supply voltage and having an output for providing a power on signal indicating the presence of the first power supply voltage;
   a switching control circuit having a first input coupled to the output of the first detection circuit, a second input coupled to the output of the second detection circuit and an output for providing a control signal; and
   at least one fuse coupled to the switching control circuit, programming of the at least one fuse being permitted in response to the control signal, the control signal being coupled to the at least one fuse by the switching control circuit if no detection of the ESD event occurs and no absence of the power on signal is detected.

2. The eFuse protection circuit of claim 1 further comprising:
   a buffer circuit coupled between the switching control circuit and the at least one fuse, the buffer circuit having an input for receiving and amplifying a voltage magnitude of the control signal and providing a fuse program voltage to the at least one fuse in response thereto.

3. The eFuse protection circuit of claim 2 wherein the switching control circuit further comprises:
   a multiple input logic gate having a first input for receiving the ESD trigger signal, a second input for receiving the power on signal, a third input for receiving a fuse program enable signal, and an output for providing the control signal in an active state when the fuse program signal is asserted, no ESD event is detected and the first power supply voltage is indicated to be present.

4. The eFuse protection circuit of claim 3 wherein the switching control circuit further comprises:
   circuitry powered by the first power supply voltage, the circuitry having an input for receiving the fuse program enable signal and buffering the fuse program enable signal.

5. The eFuse protection circuit of claim 4 wherein the switching control circuit further comprises:
   a level shifter powered by a second power supply voltage having an input coupled to an output of the circuitry powered by the first power supply voltage, the level shifter providing a shifted form of the fuse program enable signal.

6. The eFuse protection circuit of claim 5 wherein the second detection circuit further comprises:
   a comparison and level shifting circuit having a power terminal for receiving the second power supply voltage, an input terminal for receiving the first power supply voltage, and an output; and
   an inverter having an input coupled to the output of the comparison and level shifting circuit, and an output for providing the power on signal, the inverter having a power terminal for receiving the second power supply voltage.

7. The eFuse protection circuit of claim 6 wherein the at least one fuse is a plurality of fuses, each fuse of the plurality being coupled in series with a select transistor controlled by a respective different select signal, each series-coupled fuse and select transistor being coupled between a first terminal for receiving the fuse program voltage and a second terminal for receiving a reference voltage.

8. The eFuse protection circuit of claim 7 wherein the circuit pad is a power supply pad of an integrated circuit, the integrated circuit including the eFuse protection circuit.

9. A method comprising:
providing a first detector for determining whether an ESD event occurs at a circuit pad of an integrated circuit and providing an ESD trigger signal in response thereto;
providing a second detector for detecting a presence of a first power supply voltage and providing a power on signal indicating the presence of the first power supply voltage; and
permitting a fuse to be programmable when no detection of the ESD event occurs and at the same time a presence of the power on signal is detected, said fuse not being permitted to be programmed when an ESD event is detected or in an absence of the power on signal.

10. The method of claim 9 further comprising:
providing a switching control circuit having a first input coupled to an output of the first detector, a second input coupled to the output of the second detector and an output for providing a control signal.

11. The method of claim 10 further comprising:
coupling a buffer circuit between the switching control circuit and the fuse, the buffer circuit having an input for receiving and amplifying a voltage magnitude of the control signal and providing a fuse program voltage to the fuse in response thereto.

12. The method of claim 9 further comprising:
providing a multiple input logic gate having a first input for receiving the ESD trigger signal, a second input for receiving the power on signal, a third input for receiving a fuse program enable signal, and an output for providing the control signal in an active state when the fuse program signal is asserted, no ESD event is detected and the first power supply voltage is indicated to be present.

13. The method of claim 12 further comprising:
buffering and level shifting the fuse program enable signal before coupling the fuse program enable signal to the third input of the multiple input logic gate.

14. The method of claim 9 further comprising:
implementing the circuit pad as a voltage pad for receiving a second supply voltage, the second supply voltage having a magnitude that is greater than the first supply voltage and being used to derive a program voltage for the fuse.

15. A circuit, comprising:
a power supply detection circuit for detecting a presence within the circuit of a first power supply voltage, the power supply detection circuit providing a power on signal when the first power supply voltage is present in the circuit;
an ESD detection circuit coupled to a circuit pad for receiving a second power supply voltage, the ESD detection circuit detecting an ESD event at the circuit pad and providing an ESD signal in response to the detecting;
a switching control circuit having a first input coupled to the power supply detection circuit, a second input coupled to the ESD detection circuit, a third input coupled to a program enable signal, and an output for providing a control signal to permit fuse programming when no ESD event is detected, the first power supply voltage is detected and the program enable signal is asserted; and
a fuse array coupled to the switching control circuit, the fuse array comprising a plurality of fuses each coupled in series with a respective select transistor between a program voltage terminal and a reference voltage terminal, the fuse array being selectively programmed in response to the control signal.

16. The circuit of claim 15 further comprising:
a buffer circuit having an input coupled to the output of the switching control circuit and an output coupled to the program voltage terminal of the fuse array, the buffer circuit buffering the control signal to provide a fuse program supply voltage to program voltage terminal of the fuse array.

17. The circuit of claim 15 wherein the switching control circuit further comprises:
a NOR logic gate having a first input coupled to the first input of the switching control circuit, a second input coupled to the second input of the switching control circuit, a third input coupled to the third input of the switching control circuit, and an output for providing the control signal in an active state when the fuse program signal is asserted, no ESD event is detected and the first power supply voltage is indicated to be present.

18. The circuit of claim 17 wherein the switching control circuit further comprises:
circuitry powered by the first power supply voltage, the circuitry having an input for receiving the program enable signal and buffering the program enable signal; and
a level shifter powered by a second power supply voltage having an input coupled to an output of the circuitry powered by the first power supply voltage, the level shifter providing a shifted form of the program enable signal.

19. The circuit of claim 15 wherein the power supply detection circuit further comprises:
a comparison and level shifting circuit coupled to the first power supply voltage and the second power supply voltage, the comparison and level shifting circuit comparing a voltage magnitude of the first power supply voltage to a known voltage value that is dependent on the first power supply voltage to determine if the first power supply voltage is on.

20. The circuit of claim 15 wherein the plurality of fuses comprise polysilicon fuses that are programmed with a program voltage value of no greater than 3.3 volts.

* * * * *